(12) United States Patent
Thurgate et al.

(10) Patent No.: US 7,067,381 B1
(45) Date of Patent: Jun. 27, 2006

(54) STRUCTURE AND METHOD TO REDUCE DRAIN INDUCED BARRIER LOWERING

(75) Inventors: Timothy Thurgate, Sunnyvale, CA (US); Nga-Ching Wong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 63 days.

(21) Appl. No.: 10/636,336

(22) Filed: Aug. 6, 2003

(51) Int. Cl.
*H01L 21/331* (2006.01)

(52) U.S. Cl. ..................................... 438/301

(58) Field of Classification Search ................. 438/301
See application file for complete search history.

(56) References Cited

U.S. PATENT DOCUMENTS 5,976,937 A * 11/1999 Rodder et al. .............. 438/275

FOREIGN PATENT DOCUMENTS

EP 000535917 A2 * 9/1992

* cited by examiner

*Primary Examiner*—David S. Blum

(57) ABSTRACT

Embodiments of the present invention include a method for manufacturing a transistor comprising forming a gate conductor above a semiconductor substrate; forming a lightly doped implant region within the substrate, wherein the lightly doped implant region is substantially on the source side of the transistor; and forming a counter doping implant region within the substrate, wherein the counter-doping implant region is substantially on the drain side and wherein the counter-doping reduces the net channel impurity concentration on the drain side.

17 Claims, 9 Drawing Sheets

600

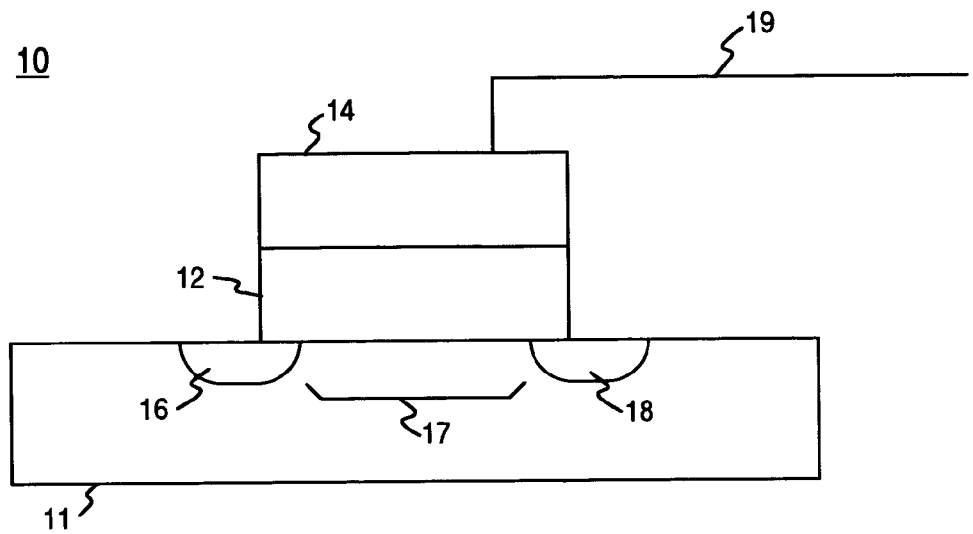
(Prior Art) Figure 1A
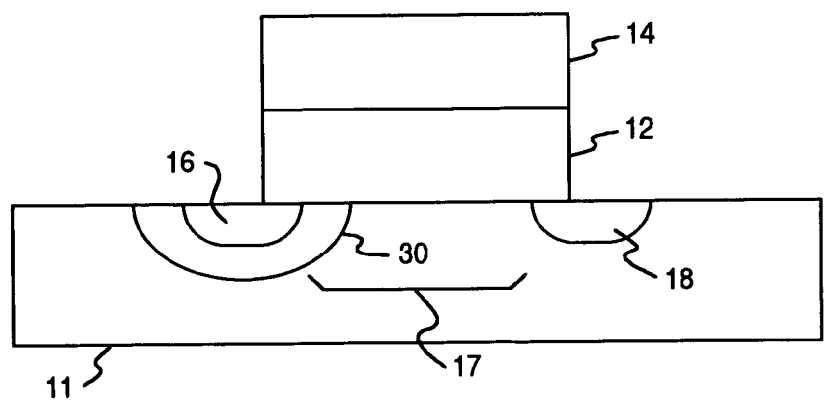
(Prior Art) Figure 1B

STRUCTURE AND METHOD TO REDUCE DRAIN INDUCED BARRIER LOWERING

FIELD OF THE INVENTION

The present invention relates to the manufacture of an integrated circuit. More specifically, embodiments of the present invention relate to the formation of an n-channel and/or p-channel asymmetrical transistor using an arsenic drain side implantation to reduce DIBL.

RELATED ART

Moore's Law states that the number of semiconductor devices, (e.g., transistors), per unit area will double every 18–24 months. While other factors such as design improvements contribute to the rapid growth, one of the fundamental drivers of this inexorable density increase is the ever-shrinking minimum feature size of semiconductors. For example, a common minimum feature size of modern semiconductors is 0.15 microns.

A modern integrated circuit, IC, for example a flash memory device, may have millions to hundreds of millions of devices made up of complex, multi-layered structures that are fabricated through hundreds of processing steps. Those structures, for example a gate stack, are formed by repeated deposition and patterning of thin films on a silicon substrate, also known as a wafer.

As channel length grows shorter, threshold voltage, the voltage required to turn on a transistor, begins to decrease and leakage current increases. These effects are commonly referred to in the semiconductor arts as the "short channel effects" (SCE). An increase in leakage current is particularly onerous in flash memory devices as flash has found wide acceptance in very low power applications, for example mobile phones, due to the ability of flash to retain information without applied power. Increases in leakage current may have a significant deleterious effect on total power consumption of the flash device and the product using the flash device.

The distance between source and drain implants is often referred to as the physical channel length. However, after implantation and subsequent diffusion of the source and drains, distance between the source and drains regions becomes less than the physical channel length and is often referred to as the effective channel length (Leff). In VLSI designs, as the physical channel becomes small, so must the Leff.

Generally speaking, SCE impacts device operation by, inter alia, reducing device threshold voltages and increasing sub-threshold currents. As Leff becomes quite small, the depletion regions associated with the source and drain areas may extend toward one another and substantially occupy the channel area. Hence, some of the channel will be partially depleted without any influence of gate voltage. As a result, less gate bias is required to invert the channel of a transistor having a short Leff. Somewhat related to threshold voltage lowering is the concept of subthreshold current flow. Even when the gate voltage is below the threshold amount, current between the source and drain nonetheless exist.

Two primary causes of increased sub-threshold current are punchthrough and drain-induced barrier lowering (DIBL). Punchthrough results from widening of the drain depletion region when a reverse-bias voltage is applied across the drain-well diode. The electric field of the drain may eventually penetrate to the source area, thereby reducing the potential energy barrier of the source-to-body junction. Punchthrough current is therefore associated within the substrate bulk material, well below the substrate surface. Contrary to punchthrough current, DIBL induced current occurs mostly at the substrate surface. Application of a drain voltage can cause the surface potential to be lowered, resulting in a lowered potential energy barrier at the surface and causing the sub-threshold current in the channel near the silicon—silicon dioxide interface to be increased. One method in which to control SCE is to increase the dopant concentration within the body of the device. Unfortunately, increasing dopant within the body deleteriously increases potential gradients in the ensuing device. For example, increasing dopant causes a hotter junction and lowers the breakdown voltage.

For example, Prior Art FIG. 1A depicts a conventional flash memory cell 10 during a pocket implant. The gate stack formed includes a floating gate 12 and a control gate 14. Included are the source 16 and drain 18. The channel 17 is between the source 16 and the drain 18. The drain is masked by photoresist 19.

The drain is masked by photoresist to ensure that little of the dopant provided by a pocket implant reaches the portion of the channel 17 near the drain 18. Typically, high DIBL results in current leakage during high voltage programming. By grading the concentration of dopant (typically Boron) between the source and drain, DIBL can be reduced, without raising the threshold voltage.

Prior Art FIG. 1B illustrates the memory cell 10 after an implant, subsequent thermal anneal and after removing photoresist 19. A thermal anneal is used to drive the source side implant across the channel. As a result, the concentration of dopant is graded across the channel length. The highest concentration is near the source and then the concentration tapers off towards the drain side. As a result, the memory cell 10 may have fewer short channel effects and DIBL can be reduced.

Although this method is effective for relatively large channel widths, as feature sizes become smaller, the concentration of dopant becomes practically flat. As a result, DIBL is not reduced to a level previously achieved.

Prior Art FIG. 2 illustrates a graph 20 depicting channel dopant concentration 22 with respect to the length of the channel 24. Channel length 28 illustrates a relatively large channel length and as a result of the relatively large channel length, the dopant concentration 22 is graded across the channel length. As mentioned above, with a relatively large channel length, a graded dopant concentration can be achieved using the above-mentioned method. As feature size continues to decrease, the channel length becomes smaller. Channel length 29 depicts a typical feature size that can be currently manufactured. As a result of the small channel length, the dopant concentration is virtually flat across the channel, thus resulting in poor reduction of DIBL.

A properly designed transistor that overcomes the above problems must therefore be applicable to an n-channel transistor. That transistor must be one that is readily fabricated within existing process technologies.

SUMMARY OF THE INVENTION

Accordingly, what is needed is a structure and method for reducing DIBL without complicating the manufacture process. The structure and method for reducing DIBL should utilize established semiconductor manufacturing equipment. In addition, the structure and method for reducing DIBL should facilitate in maintaining precise critical dimensions for small-scale semiconductor manufacturing.

A structure and method for reducing DIBL in a transistor is presented. Embodiments of the present invention include a method for manufacturing a transistor comprising forming a gate conductor above a semiconductor substrate, forming a lightly doped implant region within the substrate, wherein the lightly doped implant region is substantially on the source side of the transistor; and forming a counter doping implant region within the substrate, wherein the counter doping implant region is substantially on the drain side and wherein the counter doping reduces the net impurity concentration on the drain side Embodiments of the present invention also include a structure for reducing DIBL in a semiconductor comprising a gate conductor formed above a semiconductor substrate, a lightly doped implant region formed within the substrate, wherein the lightly doped implant region is substantially on the source side of the transistor; and a counter doping implant region formed within the substrate, wherein the counter doping implant region is substantially on the drain side and wherein the counter doping reduces the net impurity concentration on the drain side.

These and other objects and advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art FIG. 1A is an illustration of a conventional processing approach used to reduce DIBL illustrating a source implant.

Prior Art FIG. 1B is an illustration of a conventional processing approach used to reduce DIBL illustrating a source side boron implant (SSBI).

Prior Art

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, and components have not been described in detail as not to unnecessarily obscure aspects of the present invention.

The present invention provides a method and structure for reducing DIBL and short channel effects without significantly complicating processing. The method and structure provide a flash memory cell having a source and a drain. To provide the flash memory cell, a source side channel implant is first provided. In one embodiment, the source side channel implant is boron. After the source side implant is completed, an implant is done on the drain side to counter dope the boron implant on the drain side. Typically, in manufacture of a flash memory cell, there are numerous thermal anneals in subsequent steps that cause the boron to diffuse across the channel. By implanting a material (such as arsenic) that does not diffuse easily in the substrate, the net impurity concentration on the drain side is reduced, thus reducing DIBL without raisiong the gate threshold voltage.

In one embodiment of the present invention, the drain side implant is arsenic and in another embodiment, the drain side implant is phosphorus. Typically, the present invention is incorporated into the manufacture of a semiconductor device after a gate stack is formed and before a spacer is formed.

Figure 2:
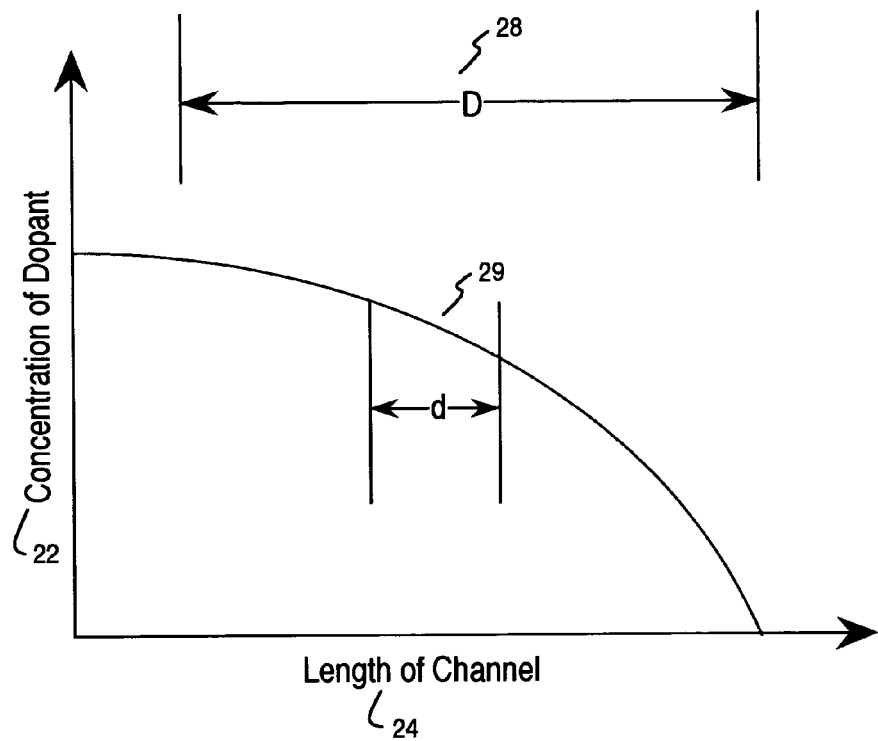
FIG. 2 is a graph showing concentrations of dopant across a channel length for 2 different channel lengths.
Figure 3:
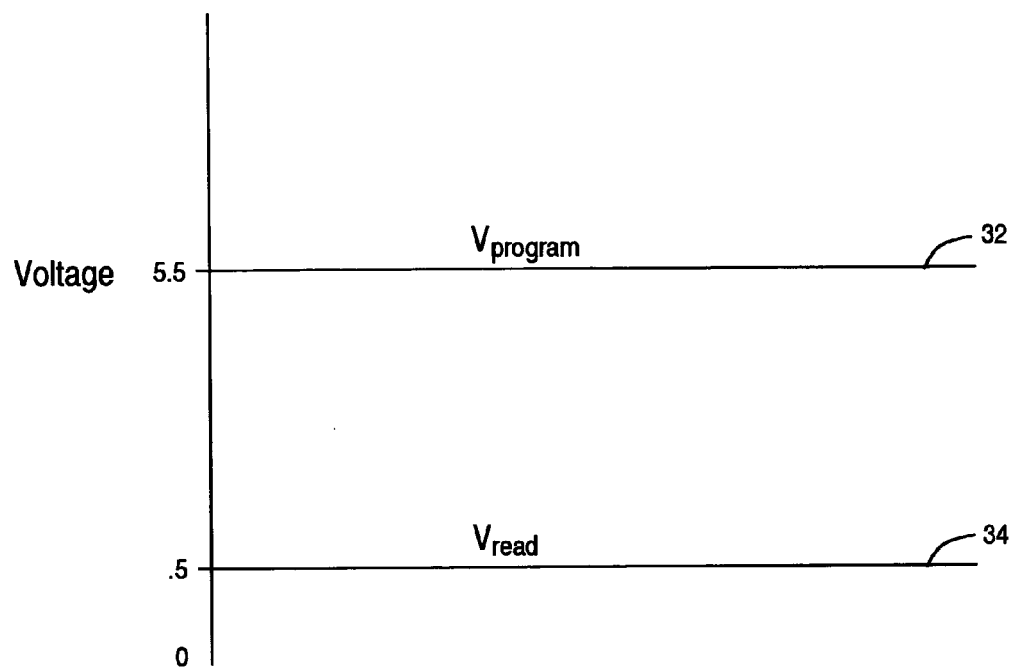
FIG. 3 is a graph illustrating the voltages applied to an exemplary semiconductor device during read and program modes in accordance with an embodiment of the present invention.

FIG. 3 is a graph 30 illustrating the difference in voltage applied to a flash memory cell during read and program activity. Typically the voltage applied to the drain during reading 34 is approximately 0.5 volts and the voltage applied to the drain during programming 32 is approximately 5.5 volts. As stated above, DIBL is the lowering of a threshold barrier voltage for the conduction of current across a transistor. DIBL becomes a concern typically when higher voltages are used during programming. When reading or programming a flash memory, voltage is applied to all devices along a bit line. If DIBL causes the threshold voltage to drop enough, current leaks across memory cells that are not selected (no gate bias) causing deleterious effects during programming.

As a result of the high voltage applied during programming, the threshold voltage difference between reading and programming causes current leakage in unselected transistors. Optimally, the difference in threshold voltage between the read bias and the program bias would be zero, but a small voltage such as 0.4 volts would be acceptable.

Figure 4:
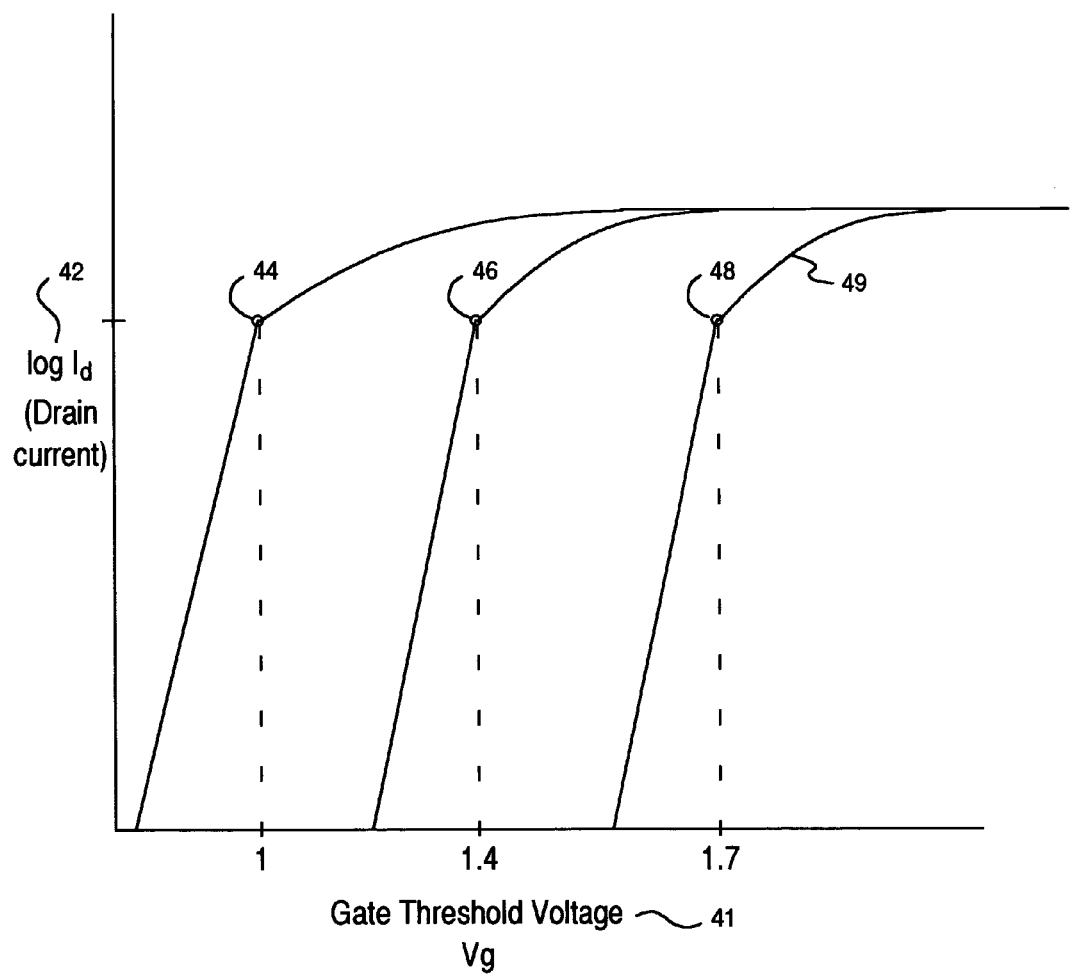
FIG. 4 is a graph illustrating the effectiveness of an exemplary semiconductor to reduce DIBL in accordance with an embodiment of the present invention.

FIG. 4 is a graph 40 showing the difference in gate threshold voltages between read and program in a flash memory cell. The graph 40 plots the log of drain current 42 against the gate voltage 41. Ideally, the difference in threshold voltage between read and program would be zero. Data plot 48 and 49 illustrate an example of an ideal situation wherein the difference in gate threshold voltage is zero. For example, for data plot 48 (corresponding to read) and 49 (corresponding to program) have a gate threshold voltage of 1.7 volts (the two plots overlap and appear as one data plot). In this ideal case, wherein the difference in threshold is zero, DIBL is non-existent. This example wherein DILB is zero is for illustrative purposes to show ideal conditions.

When using a high voltage for programming, the difference between the read and program threshold voltage can be substantial. For example, data plot 44 corresponds to the behavior of a transistor during high voltage programming when conventional channel doping is used to prevent DIBL. The threshold voltage for data plot 44 (program) is approximately 1 volt, wherein the threshold voltage for data plot 48 (read) is 1.7 volts. The difference in threshold voltage (DIBL) between read and program is approximately 0.7 volts. With DIBL close to 0.7 volts, leakage across unselected transistors is substantial and the leakage causes deleterious effects during programming and in some cases makes programming impossible.

By using a counter dopant to reduce the net impurity concentration near the drain in accordance with embodiments of the present invention, DIBL can be reduced to an acceptable level. For example, data plot 46 (program) illustrates how a transistor would behave when treated with a drain side counter doping in accordance with embodiments of the present invention. As opposed to data plot 44 with a threshold voltage of 1 volt, data plot 56 has a threshold voltage of 1.4 volts. When compared to the read threshold voltage of 1.7 volts, the difference in gate threshold voltage (DIBL) between read and program is only 0.3 volts. By using a drain side counter doping to control the diffusion of a source implant, DIBL is reduced substantially.

For purposes of clarity, process 500 of FIG. 5 will be described in conjunction with the structure 600 of FIGS. 6A–6E which illustrate structure 600 as it undergoes process 500 in accordance with an embodiment of the present invention.

Figure 5:
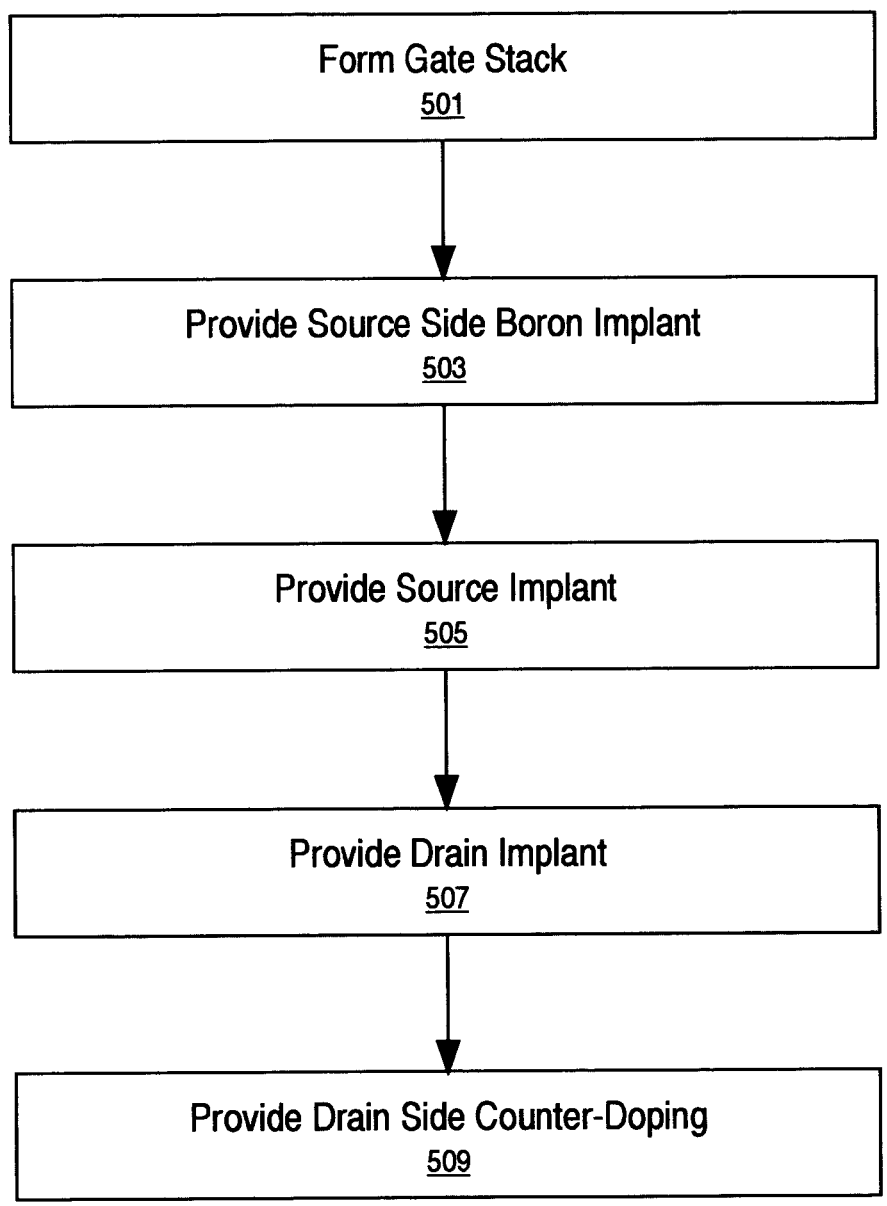
FIG. 5 is a flow diagram of an exemplary semiconductor manufacture process is implemented to reduce DIBL in accordance with an embodiment of the present invention.

FIG. 5 is a flow diagram of an exemplary process 500 wherein counter doping is implanted on the drain side of a semiconductor device to reduce DIBL. Typically, a drain side counter-doping would be implanted after a gate stack is formed. Detailed processing steps of forming and cutting a gate stack are eliminated from process 500 for clarity. In addition, intermediate processing steps such as rapid thermal anneals (RTAs) and spacer formations are not included in process 500 for clarity. While many processing steps may be provided in-between the processing steps of the present invention, the additional steps have very little bearing on the details of process 500 of the present invention.

Figure 6A:
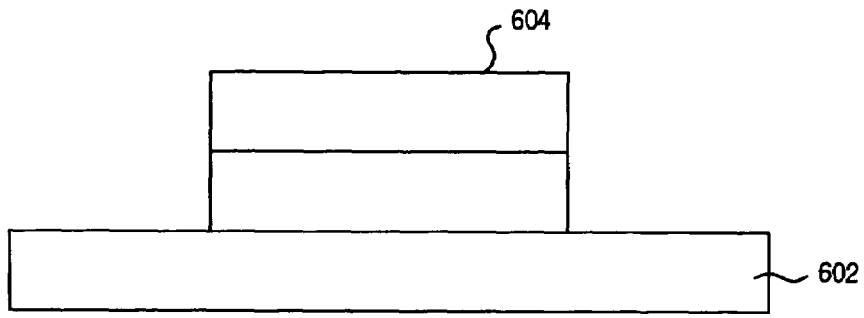
FIG. 6A is an illustration of an exemplary semiconductor device illustrating a gate stack in accordance with an embodiment of the present invention.
Figure 6B:
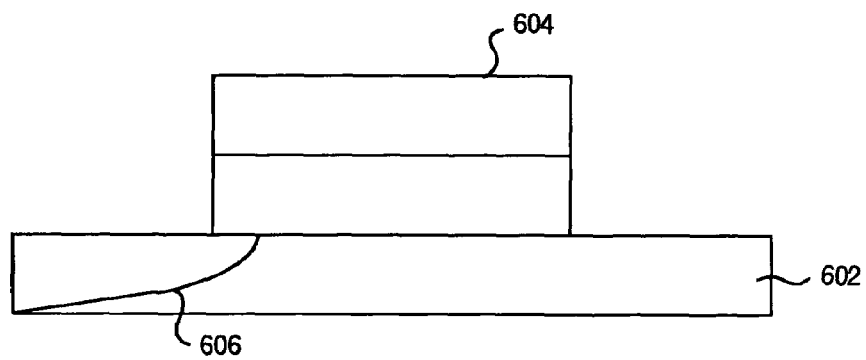
FIG. 6B is an illustration of an exemplary semiconductor device illustrating a source side boron implant in accordance with an embodiment of the present invention.

Process 500 of FIG. 5 starts with step 501 to form the gate stack 604 above substrate 602 as illustrated in FIG. 6A. After the gate stack is formed, in step 503, a source side boron implant (SSBI) 606 of FIG. 6B is provided using conventional processing steps used in the art. Typically, the SSBI is a vertical implant because physical space limitations prevent an angled implant on the source. Many times, sources are in very close in proximity to each other and combined with a relatively tall gate stack an angled implant is not feasible. Dosage of the SSBI is approximately $1.5 \times 10^{14}$ p/cm$^2$ (particles per square centimeter). The length of the SSBI 608 of FIG. 6B is exaggerated for illustrative purposes.

Figure 6C:
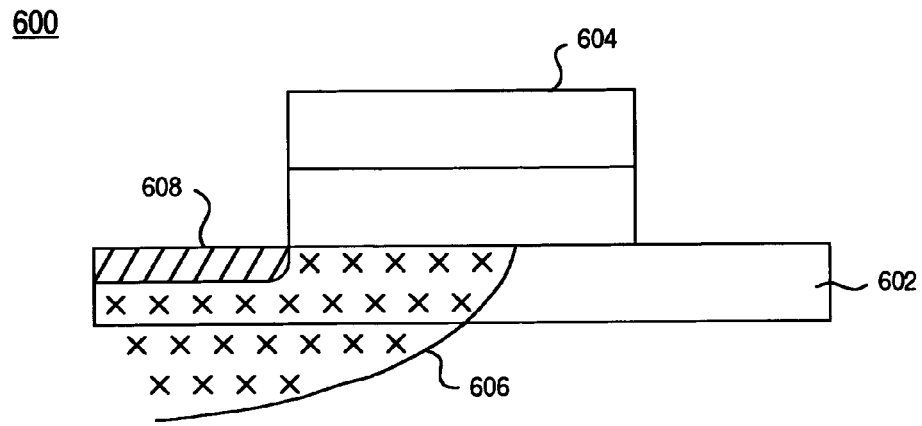
FIG. 6C is an illustration of an exemplary semiconductor device illustrating a source implant in accordance with an embodiment of the present invention.
Figure 6D:
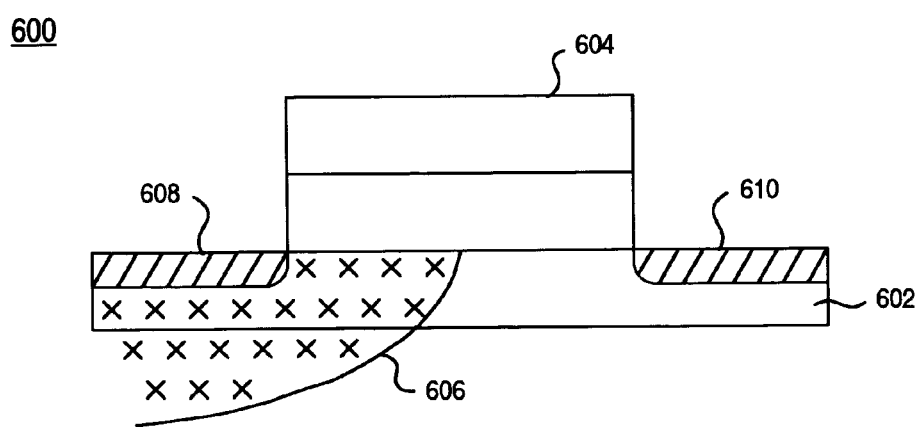
FIG. 6D is an illustration of an exemplary semiconductor device illustrating a drain side implant in accordance with an embodiment of the present invention.
Figure 6E:
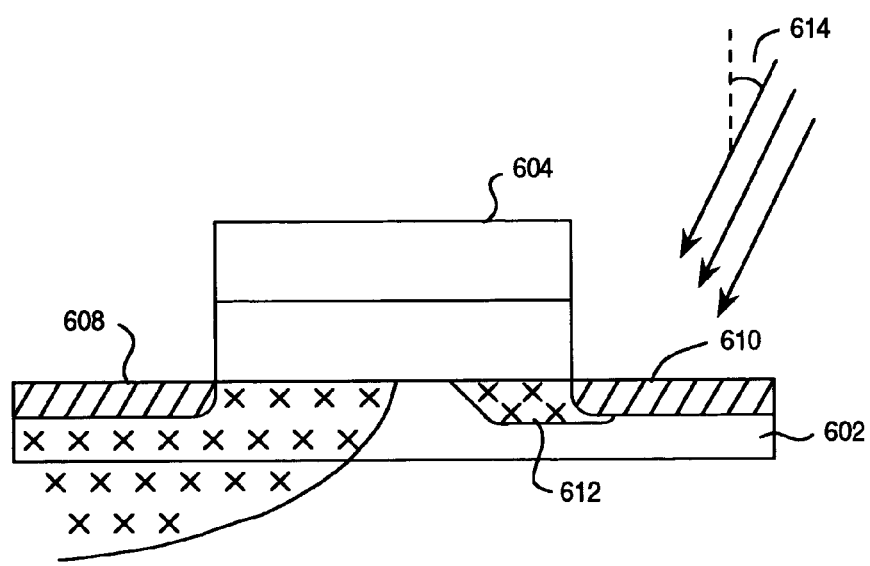
FIG. 6E is an illustration of an exemplary semiconductor device illustrating a drain side counter doping implant in accordance with an embodiment of the present invention.

Next in step 505, a source implant 608 of FIG. 6C is provided to form the source. Typically, the source doping is an n-type dopant. After the source implant is provided, in step 507, a drain implant 610 of FIG. 6D is provided to form the drain. Typically, the drain implant is also an n-type dopant. Then in step 509, a drain side counter doping 612 of FIG. 6E is provided to redude the net channel doping near the drain. In one embodiment of the present invention, a drain side counter-doping 612 is arsenic. In another embodiment of the present invention, a drain side counter-doping 612 is phosphorous. Dosage of the drain side counter-doping is around $1 \times 10^{14}$ p/cm$^2$. When providing a drain side counter-doping late in the processing steps, typically an angled implant is done to implant underneath the gate stack as far as possible. In one embodiment of the present invention, an angled counter-doping implant is provided at an angle 614 of FIG. 6E within approximately 30 degrees of perpendicular to the surface of the semiconductor. If an angled implant is not feasible, a vertical implant is done and then subsequent thermal cycles are provided to drive the counter-doping across the channel length.

The present invention, a drain side counter-doping to reduce DIBL, can be implemented between many different processing steps of the manufacture of a transistor. Process 500 illustrates an "late" approach wherein the counter-doping is provided by an angled implant. Alternatively, in the case wherein an angled implant is infeasible, an "early" approach is used wherein a vertical implant is used in conjunction with a thermal cycle to drive the counter-doping across the channel length. Process 500 of the present invention can be applied after forming a gate stack but before forming a spacer.

Figure 7A:
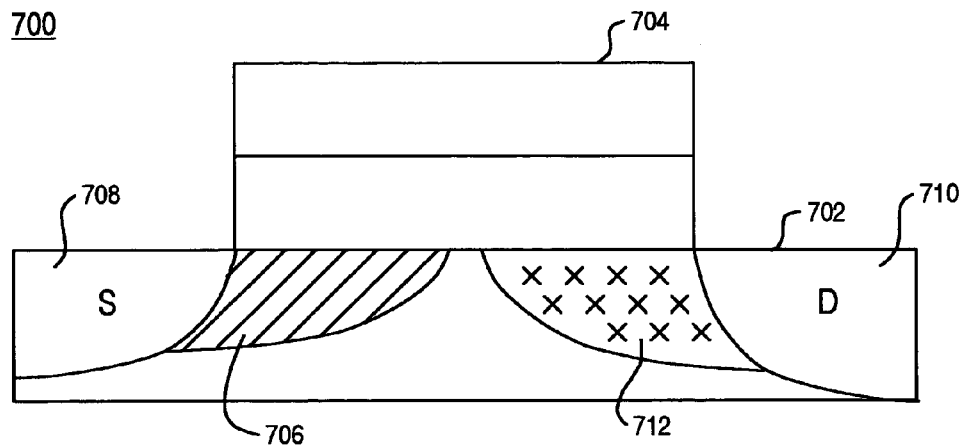
FIG. 7A is a close up view of an exemplary semiconductor device illustrating a graded concentration of a source side boron implant (SSBI) in accordance with an embodiment of the present invention.

FIG. 7A is a close up illustration of semiconductor 700 in accordance with an embodiment of the present invention. Semiconductor 700 comprises a gate stack 704 formed above a substrate 702. A source 708 has been formed on one side and a drain 710 has been formed on the opposite side. A SSBI 706 has been formed on the source side and a counter doping 712 has been formed on the drain side. FIG. 8A illustrates a graded concentration of doping (SSBI 706) on the source side because of the presence of the counter-doping 712 on the drain side.

Figure 7B:
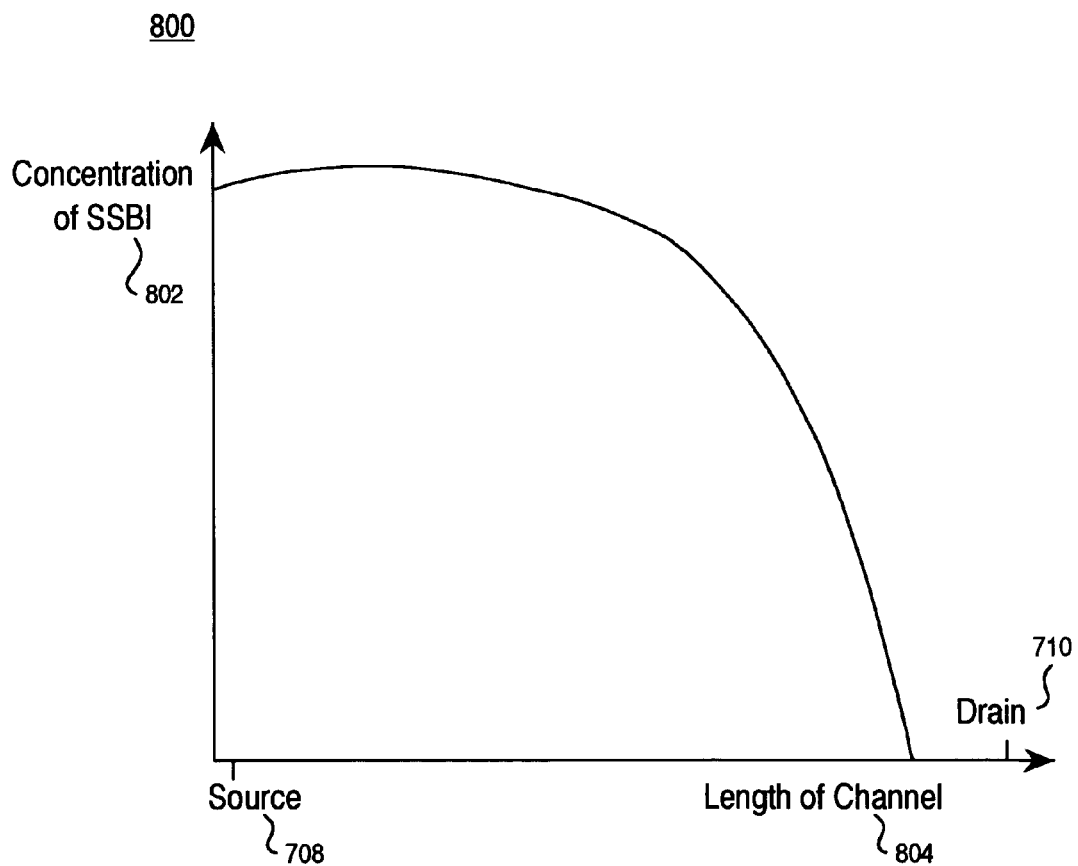
FIG. 7B is a graph showing an alternative view of the graded concentration of a source side boron implant in accordance with an embodiment of the present invention.

FIG. 7B is a graph 800 illustrating the concentration of doping across the channel length in accordance with an embodiment of the present invention. Graph 800 plots the concentration of SSBI 802 against the channel length 804 of a semiconductor. The concentration of the SSBI is greatest on the source side 708 and then slopes across the length of the channel towards the drain 710.

A beneficial consequence of implanting a drain side counter-doping is that the concentration if the SSBI is graded, thus reducing DIBL to a reasonable level even when feature size is small. The presence of arsenic (or phosphorous) on the drain side of a transistor allows the formation of a steeper graded concentration of the net doping on the source side of the transistor. A non-uniform concentration of the SSBI at the source reduces DIBL without increasing the gate threshold voltage.

Embodiments of the present invention, a structure and method for reducing DIBL have been described. While the present invention has been described in particular embodiments, it should be appreciated that the present invention should not be construed as limited by such embodiments, but rather construed according to the following claims.

The foregoing descriptions of specific embodiments of the present invention have been presented for purposes of illustration and description. They are not intended to be exhaustive or to limit the invention to the precise forms disclosed. The embodiments were chosen and described in order to best explain the principles of the invention and it's practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for reducing drain induced barrier lowering in a semiconductor having a length between a drain side and a source side comprising:
    a) forming a gate stack above a semiconductor substrate, wherein said gate stack masks an area of said drain said and an area of said source side;
    b) depositing a source side boron implant in said substrate using only said gate stack to mask said source side; and
    c) depositing a drain side counter-doping implant in said substrate using only said gate stack to mask said drain side wherein said drain side counter-doping implant reduces the net channel impurity concentration on said drain side which reduces drain induced barrier lowering.

2. The method as described in claim 1 further comprising annealing said semiconductor, wherein annealing allows said source side boron implant to diffuse to a desired location between said source side and said drain side.

3. The method as described in claim 1 wherein said drain side counter-doping is deposited by an angled implant.

4. The method as described in claim 3 wherein said semiconductor comprises a top surface and wherein said counter-doping is implanted at an angle within 30 degrees of perpendicular to said top surface of said semiconductor.

5. The method as described in claim 1 wherein said counter-doping is arsenic.

6. The method as described in claim 1 wherein said counter-doping is deposited at a dose around $1.0 \times 10^{14}$ particles per square centimeter.

7. The method as described in claim 1 wherein said source side boron implant is deposited at a dose around $1.5 \times 10^{14}$ particles per square centimeter.

8. The method as described in claim 1 wherein said semiconductor is a flash memory cell.

9. The method as described in claim 1 wherein said counter doped drain side results in a graded concentration of net doping across said length between said source and said drain.

10. A method for manufacturing a transistor comprising:
    a) forming a gate conductor above a semiconductor substrate, wherein said gate conductor masks an area of said drain said and an area of said source side;
    b) forming a lightly doped implant region within said substrate, wherein said lightly doped implant region is substantially on a source side of said transistor using only said gate conductor to mask said source side; and
    c) forming a counter doping implant region within said substrate, wherein said counter-doping implant region is substantially on a drain side of said transistor using only said gate conductor to mask said drain side and wherein said counter-doping reduces the net channel impurity concentration on said drain side.

11. The method as described in claim 10 wherein said lightly doped implant region comprises boron.

12. The method as described in claim 10 wherein said counter-doping implant region comprises arsenic.

13. The method as described in claim 10 further comprising annealing said transistor, wherein annealing said transistor promotes diffusion of said counter-doping.

14. The method as described in claim 10 wherein said counter-doping is formed by an angled implant.

15. The method as described in claim 10 wherein said lightly doped implant is formed with a dose of $1.5 \times 10^{14}$ particles per square centimeter.

16. The method as described in claim 10 wherein said counter-doping is formed with a dose of $1.0 \times 10^{14}$ particles per square centimeter.

17. The method as described in claim 10 wherein said transistor is used in a flash memory device.

* * * * *